(12) United States Patent
Kim et al.

(10) Patent No.: US 10,600,645 B2
(45) Date of Patent: Mar. 24, 2020

(54) MANUFACTURING METHOD OF GALLIUM NITRIDE SUBSTRATE

(71) Applicant: SAMSUNG ELECTRONICS CO., LTD., Suwon-si, Gyeonggi-do (KR)

(72) Inventors: Mi Hyun Kim, Seoul (KR); Sam Mook Kang, Hwaseong-si (KR); Jun Youn Kim, Hwaseong-si (KR); Young Jo Tak, Seongnam-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 54 days.

(21) Appl. No.: 15/662,425

(22) Filed: Jul. 28, 2017

(65) Prior Publication Data
US 2018/0174823 A1 Jun. 21, 2018

(30) Foreign Application Priority Data
Dec. 15, 2016 (KR) .................. 10-2016-0171563

(51) Int. Cl.
*H01L 21/02* (2006.01)
*C30B 25/18* (2006.01)
(Continued)

(52) U.S. Cl.
CPC .......... *H01L 21/0254* (2013.01); *C30B 25/02* (2013.01); *C30B 25/04* (2013.01); *C30B 25/183* (2013.01); *C30B 25/186* (2013.01); *C30B 29/406* (2013.01); *H01L 21/0206* (2013.01); *H01L 21/0217* (2013.01); *H01L 21/02027* (2013.01); *H01L 21/0243* (2013.01); *H01L 21/0262* (2013.01); *H01L 21/02068* (2013.01); *H01L 21/02096* (2013.01); *H01L 21/02164* (2013.01); *H01L 21/02178* (2013.01);
(Continued)

(58) Field of Classification Search
CPC ......... H01L 21/02458; H01L 21/02488; H01L 21/02491; H01L 21/02381; H01L 21/0243; H01L 21/02027; H01L 21/02068; H01L 21/0206; H01L 21/02502; C30B 25/183; C30B 25/186; C30B 25/02; B08B 3/024; B08B 3/12
See application file for complete search history.

(56) References Cited

U.S. PATENT DOCUMENTS 6,365,921 B1 * 4/2002 Watanabe ........... H01L 21/0242
257/200
6,468,347 B1 * 10/2002 Motoki .................. C30B 25/02
117/106

(Continued)

FOREIGN PATENT DOCUMENTS

KR 10-1999-0062035 A 7/1999
KR 10-0834698 B1 5/2008
(Continued)

*Primary Examiner* — Sophia T Nguyen
(74) *Attorney, Agent, or Firm* — Lee IP Law, PC

(57) ABSTRACT

A method of manufacturing a gallium nitride substrate, the method including forming a first buffer layer on a silicon substrate such that the first buffer layer has one or more holes therein; forming a second buffer layer on the first buffer layer such that the second buffer layer has one or more holes therein; and forming a GaN layer on the second buffer layer, wherein the one or more holes of the first buffer layer are filled by the second buffer layer.

18 Claims, 5 Drawing Sheets

(51) Int. Cl.
*C30B 25/04* (2006.01)
*C30B 25/02* (2006.01)
*C30B 29/40* (2006.01)
*H01L 21/78* (2006.01)
*B08B 3/02* (2006.01)
*B08B 3/12* (2006.01)

(52) U.S. Cl.
CPC .. *H01L 21/02181* (2013.01); *H01L 21/02247* (2013.01); *H01L 21/02271* (2013.01); *H01L 21/02304* (2013.01); *H01L 21/02307* (2013.01); *H01L 21/02381* (2013.01); *H01L 21/02433* (2013.01); *H01L 21/02458* (2013.01); *H01L 21/02488* (2013.01); *H01L 21/02491* (2013.01); *H01L 21/02499* (2013.01); *H01L 21/02502* (2013.01); *H01L 21/02505* (2013.01); *H01L 21/02598* (2013.01); *H01L 21/02642* (2013.01); *H01L 21/02658* (2013.01); *H01L 21/02664* (2013.01); *B08B 3/024* (2013.01); *B08B 3/12* (2013.01); *H01L 21/7806* (2013.01)

(56) References Cited

U.S. PATENT DOCUMENTS

| | | | |
|---|---|---|---|
| 6,555,846 B1* | 4/2003 | Watanabe | H01L 21/0242 257/103 |
| 6,972,051 B2 | 12/2005 | Tischler et al. | |
| 7,459,023 B2* | 12/2008 | Yamazaki | C30B 9/00 117/104 |
| 7,612,361 B2* | 11/2009 | Park | H01L 21/02381 257/13 |
| 7,708,832 B2* | 5/2010 | Kim | C30B 25/02 117/83 |
| 7,915,150 B2 | 3/2011 | Park et al. | |
| 8,129,711 B2* | 3/2012 | Kang | H01L 33/0075 257/17 |
| 8,425,681 B1* | 4/2013 | Wang | C30B 29/403 117/104 |
| 8,507,947 B2* | 8/2013 | Ramdani | H01L 21/02458 257/190 |
| 8,846,504 B1 | 9/2014 | Dargis et al. | |
| 8,932,403 B1* | 1/2015 | Li | C30B 25/183 117/89 |
| 9,053,931 B2 | 6/2015 | Yoshida et al. | |
| 9,245,736 B2* | 1/2016 | Ziad | H01L 21/02598 |
| 9,259,895 B2* | 2/2016 | Park | B32B 9/04 |
| 9,666,754 B2* | 5/2017 | Park | H01L 33/007 |
| 9,899,565 B2* | 2/2018 | Tak | H01L 21/02381 |
| 9,947,530 B2* | 4/2018 | Tak | H01L 21/02381 |
| 2002/0170489 A1* | 11/2002 | Biwa | C30B 25/02 117/101 |
| 2003/0203531 A1* | 10/2003 | Shchukin | B82Y 10/00 438/77 |
| 2003/0222346 A1* | 12/2003 | Yun | H01L 21/28556 257/751 |
| 2004/0067648 A1* | 4/2004 | Morita | C30B 25/02 438/689 |
| 2004/0169192 A1* | 9/2004 | Kato | H01L 21/0237 257/103 |
| 2004/0200406 A1* | 10/2004 | Peczalski | C30B 25/02 117/95 |
| 2005/0064206 A1* | 3/2005 | Akita | C30B 25/02 428/446 |
| 2005/0106849 A1* | 5/2005 | Gwo | H01L 21/02381 438/602 |
| 2005/0124161 A1* | 6/2005 | Rawdanowicz | C30B 23/02 438/689 |
| 2005/0208687 A1* | 9/2005 | Kasai | C30B 25/02 438/22 |
| 2006/0099781 A1* | 5/2006 | Beaumont | C30B 25/02 438/509 |
| 2006/0261353 A1* | 11/2006 | Bandoh | H01L 33/32 257/79 |
| 2006/0266281 A1* | 11/2006 | Beaumont | C30B 25/02 117/84 |
| 2007/0026594 A1* | 2/2007 | Takeuchi | G01N 21/31 438/197 |
| 2007/0138505 A1* | 6/2007 | Preble | C30B 25/02 257/190 |
| 2007/0217460 A1* | 9/2007 | Ishibashi | B82Y 20/00 372/45.01 |
| 2008/0132060 A1* | 6/2008 | Luoh | H01L 21/2855 438/653 |
| 2008/0230800 A1* | 9/2008 | Bandoh | H01L 21/0237 257/103 |
| 2009/0324825 A1* | 12/2009 | Evenson | C23C 16/303 427/255.22 |
| 2010/0090313 A1* | 4/2010 | Nakahata | C30B 25/02 257/615 |
| 2010/0229788 A1* | 9/2010 | Lo | C30B 23/02 117/87 |
| 2010/0248459 A1* | 9/2010 | Makabe | C23C 16/303 438/478 |
| 2010/0272141 A1* | 10/2010 | Fujikura | C30B 25/183 372/45.01 |
| 2011/0018104 A1* | 1/2011 | Nagashima | C30B 25/183 257/615 |
| 2011/0042684 A1* | 2/2011 | Tanizaki | C30B 23/002 257/76 |
| 2011/0236175 A1* | 9/2011 | Shibata | C23C 14/566 414/805 |
| 2011/0244617 A1* | 10/2011 | Su | C23C 16/301 438/46 |
| 2012/0007039 A1* | 1/2012 | Ueta | H01L 21/0237 257/13 |
| 2012/0086017 A1* | 4/2012 | Hwang | H01L 21/0237 257/76 |
| 2012/0199810 A1* | 8/2012 | Lee | H01L 21/02381 257/13 |
| 2012/0231608 A1* | 9/2012 | Shibata | H01L 21/0242 438/458 |
| 2012/0255486 A1* | 10/2012 | Jiang | C23C 16/4405 117/88 |
| 2012/0291698 A1* | 11/2012 | Melnik | C30B 25/14 117/99 |
| 2013/0026480 A1* | 1/2013 | Fenwick | H01L 21/02381 257/76 |
| 2013/0082273 A1* | 4/2013 | Ting | H01L 21/02458 257/76 |
| 2013/0087762 A1* | 4/2013 | Hung | C30B 23/02 257/13 |
| 2013/0112939 A1* | 5/2013 | Chen | H01L 21/02381 257/13 |
| 2013/0140525 A1* | 6/2013 | Chen | H01L 21/02381 257/22 |
| 2013/0143396 A1* | 6/2013 | Sudarshan | H01L 21/02658 438/503 |
| 2013/0178049 A1* | 7/2013 | Lee | H01L 21/02656 438/492 |
| 2013/0269600 A1* | 10/2013 | Sato | C30B 25/18 117/89 |
| 2013/0344244 A1* | 12/2013 | Du | C23C 16/4407 427/255.5 |
| 2014/0027777 A1* | 1/2014 | Lee | C30B 25/183 257/76 |
| 2014/0137795 A1* | 5/2014 | Chang | C30B 25/183 117/95 |
| 2014/0332849 A1* | 11/2014 | Jang | H01L 29/7783 257/190 |
| 2015/0069418 A1* | 3/2015 | Heo | H01L 33/22 257/79 |
| 2015/0082625 A1* | 3/2015 | Rice | H01L 21/67196 29/825 |
| 2015/0099348 A1* | 4/2015 | Lee | H01L 21/02642 438/478 |
| 2015/0194442 A1* | 7/2015 | Ishibashi | H01L 21/76251 428/137 |

(56) References Cited

U.S. PATENT DOCUMENTS

| | | | |
|---|---|---|---|
| 2015/0203990 A1* | 7/2015 | Dargis | H01L 21/02293 257/76 |
| 2015/0221502 A1* | 8/2015 | Mino | H01L 21/02381 428/450 |
| 2015/0221563 A1* | 8/2015 | Iliopoulos | H01L 22/12 438/7 |
| 2015/0243494 A1* | 8/2015 | Hayden | H01L 21/0254 257/76 |
| 2015/0380496 A1* | 12/2015 | Ishibashi | H01L 33/32 257/615 |
| 2016/0284923 A1* | 9/2016 | Johnson | H01L 31/02167 |
| 2016/0351748 A1* | 12/2016 | Park | H01L 33/007 |
| 2017/0029977 A1* | 2/2017 | Hagimoto | H01L 21/02381 |
| 2017/0069785 A1* | 3/2017 | Tak | H01L 33/0075 |
| 2017/0213718 A1* | 7/2017 | Sundaram | C30B 25/02 |
| 2017/0271187 A1* | 9/2017 | Zhou | H01L 21/67201 |
| 2017/0330745 A1* | 11/2017 | Nagashima | C30B 25/14 |
| 2017/0358443 A1* | 12/2017 | Tak | H01L 21/02381 |
| 2017/0365469 A1* | 12/2017 | Janzen | H01L 21/02378 |
| 2018/0112330 A1* | 4/2018 | Kim | H01L 21/02658 |
| 2018/0166302 A1* | 6/2018 | Kang | H01L 21/67069 |
| 2018/0174823 A1* | 6/2018 | Kim | H01L 21/0254 |
| 2018/0274126 A1* | 9/2018 | Yui | H01L 21/02378 |
| 2018/0315599 A1* | 11/2018 | Berry | H01L 29/1606 |
| 2018/0323071 A1* | 11/2018 | Shatalov | H01L 29/2003 |
| 2018/0331503 A1* | 11/2018 | Yoshida | H01S 3/0675 |

FOREIGN PATENT DOCUMENTS

| | | |
|---|---|---|
| KR | 10-1270170 B1 | 5/2013 |
| KR | 10-2014-0036412 A | 3/2014 |

* cited by examiner

MANUFACTURING METHOD OF GALLIUM NITRIDE SUBSTRATE

CROSS-REFERENCE TO RELATED APPLICATION

Korean Patent Application No. 10-2016-0171563, filed on Dec. 15, 2016, in the Korean Intellectual Property Office, and entitled: "Manufacturing Method of Gallium Nitride Substrate," is incorporated by reference herein in its entirety.

BACKGROUND

1. Field

Embodiments relate to a manufacturing method of a gallium nitride substrate.

2. Description of the Related Art

Gallium nitride (GaN) is a material that is useful for fabricating a light emitting element having a short wavelength region (as a wide bandgap semiconductor material that has bandgap energy of about 3.39 eV and is a direct transition type).

SUMMARY

The embodiments may be realized by providing a method of manufacturing a gallium nitride substrate, the method including forming a first buffer layer on a silicon substrate such that the first buffer layer has one or more holes therein; forming a second buffer layer on the first buffer layer such that the second buffer layer has one or more holes therein; and forming a GaN layer on the second buffer layer, wherein the one or more holes of the first buffer layer are filled by the second buffer layer.

The embodiments may be realized by providing a method of manufacturing a gallium nitride substrate, the method including forming a first buffer layer on a silicon substrate such that the first buffer layer has one or more holes therein; forming a silicon nitride region on the silicon substrate exposed by the one or more holes; and forming a GaN layer on the first buffer layer.

The embodiments may be realized by providing a method of manufacturing a gallium nitride substrate, the method including forming a first buffer layer on a silicon substrate such that the first buffer layer has one or more holes therein; forming a silicon nitride region on the silicon substrate exposed by the one or more holes; forming a second buffer layer on the first buffer layer such that the second buffer layer has one or more holes therein; forming an insulating layer pattern at an edge of an upper surface of the second buffer layer; forming a GaN layer on the second buffer layer and the insulating layer pattern; and removing the insulating layer pattern.

The embodiments may be realized by providing a method of manufacturing a gallium nitride substrate, the method including providing a silicon substrate; forming a first buffer layer on the silicon substrate such that the first buffer layer includes at least one hole therethrough exposing a portion of the silicon substrate; forming a barrier at the at least one hole in the first buffer layer; forming a GaN layer on the first buffer layer such that the GaN layer is physically separated from the silicon of the silicon substrate; and separating the GaN layer.

BRIEF DESCRIPTION OF THE DRAWINGS

Features will be apparent to those of skill in the art by describing in detail exemplary embodiments with reference to the attached drawings in which.

DETAILED DESCRIPTION

Hereinafter, a method of manufacturing a gallium nitride substrate according to an exemplary embodiment will be described in detail with reference to the accompanying drawings.

Figure 1:
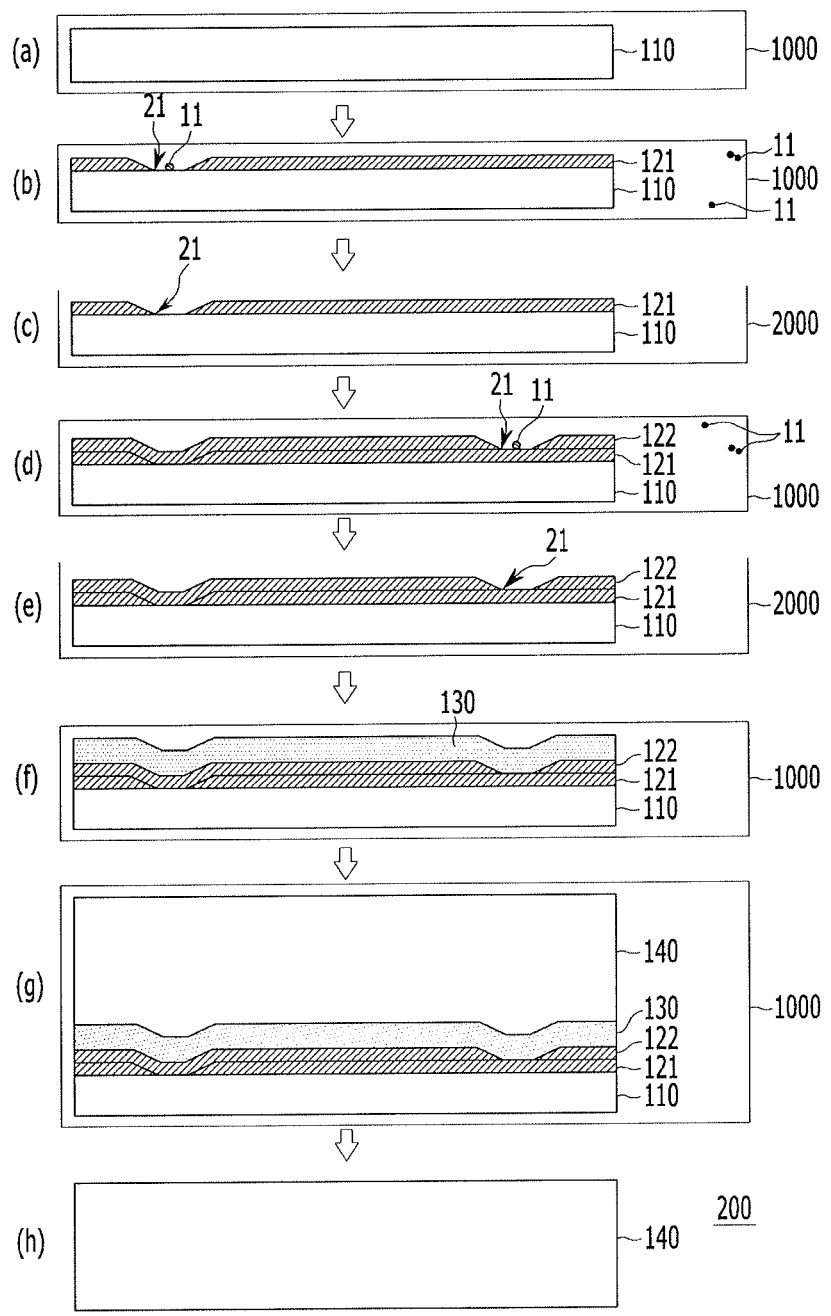
FIG. 1 illustrates a cross-sectional view of stages in a manufacturing process of a gallium nitride substrate according to an exemplary embodiment.

FIG. 1 illustrates a cross-sectional view of stages in a manufacturing process of a gallium nitride substrate according to an exemplary embodiment.

Referring to part (a) of FIG. 1, first, a substrate 110 may be prepared. The substrate 110 may be a silicon substrate.

The silicon substrate 110 may be a substrate that is most widely used in a general semiconductor process and may have features that the price is low, a large wafer may be fabricated, and thermal conductivity may be excellent. In an implementation, a surface orientation of the silicon substrate 110 formed with a buffer layer and the like may be {111}. A surface of the silicon substrate 110 having the surface orientation of {111} may have a lattice constant of about 3.8403 Å. A surface of the silicon substrate 110 having a surface orientation of {100} may have a lattice constant of about 5.40 Å. Accordingly, when considering that the lattice constant of gallium nitride is about 3.189 Å, the surface orientation of the silicon substrate 110 may be {111}.

The silicon substrate 110 may have a thickness of 100 μm to 1,000 μm. A diameter of the gallium nitride substrate may be determined according to a diameter of the silicon substrate 110, and a large-area silicon substrate 110 may be used for manufacturing a large-area gallium nitride substrate. In an implementation, the silicon substrate 110 may have a diameter of 6 inches to 18 inches.

Next, referring to part (b) of FIG. 1, a first buffer layer 121 may be formed on the silicon substrate 110. The first buffer layer 121 may include a material having a small difference in lattice constant from a GaN layer 140 (to be grown in a subsequent process). The first buffer layer 121 may be included to help reduce and/or prevent melt back. Melt back is a phenomenon in which when GaN is grown on the silicon substrate 110, if the silicon and the GaN were to directly contact each other, a phenomenon in which the silicon is diffused into the GaN to etch the surface of the silicon substrate 110 could occur.

For example, the first buffer layer 121 may help reduce a crystal defect, which could otherwise be generated due to differences in lattice constant mismatch and thermal expansion coefficient between the GaN layer 140 and the silicon substrate 110 while the GaN layer 140 is formed on the silicon substrate 110. The first buffer layer 121 may help remove or compensate for stress caused in the GaN layer 140 and help prevent cracks from being generated in the GaN layer 140, help prevent melt-back etching by a chemical action of the silicon substrate 110, and help prevent Ga atoms of the GaN layer 140 from penetrating into the silicon substrate 110.

In an implementation, the first buffer layer 121 may include, e.g., AlN, TaN, TiN, HfN or HfTi. In an implementation, a material of the first buffer layer 121 may be selected with a view toward preventing Ga atoms from contacting the silicon substrate 110, and may not include Ga.

The first buffer layer 121 may be formed by, e.g., a hydride vapor phase epitaxy (HVPE) method or a metal organic chemical vapor deposition (MOCVD) method.

In the case where the first buffer layer 121 is AlN, the first buffer layer 121 may be formed by the following method as an example. First, an Al coating layer may be formed on the silicon substrate 110 using (e.g., providing) a trimethyl aluminum (TMAl) source at a high temperature (e.g., 1,000° C. to 1,200° C.). Next, at a temperature of 1,000° C. to 1,200° C. and under a hydrogen atmosphere, $NH_3$ may react with the Al coating layer by flowing $NH_3$ on an upper surface of the silicon substrate 110 (e.g., on the Al coating layer) to form an aluminum nitride (AlN) layer. The formed aluminum nitride layer may be the first buffer layer 121.

In an implementation, the first buffer layer 121 may be formed by other suitable methods.

The first buffer layer 121 may have a thickness of, e.g., 5 nm to 10 μm. In an implementation, the first buffer layer 121 may have a thickness of, e.g., 500 nm to 1.5 μm.

In the process of forming the first buffer layer 121, if contaminants or foreign particles 11 are present in a deposition chamber, the first buffer layer 121 may not formed on (e.g., portions of) the surface of the silicon substrate 110. The foreign particles 11 may include, e.g., inorganic particles such as gallium particles in the deposition chamber 1000. For example, in the process of depositing the GaN layer 140 and the like in the deposition chamber 1000, some Ga particles could remain as contaminants in the chamber without being deposited on the substrate. If the residual foreign particles 11 were to find their way onto the silicon substrate 110 in the process of depositing the first buffer layer 121, the first buffer layer 121 could not deposited on the surface of the silicon substrate 110 (e.g., where the foreign particle 11 is on the silicon substrate 110). In an implementation, the size of the particle 11 may be, e.g., 10 nm to 1000 nm.

Referring to part (b) of FIG. 1, in a region where the particles 11 are positioned, sources could be concentrated in the particles 11 and thus the silicon substrate 10 around the particles 11 may not be covered by the first buffer layer 121, but rather may remain exposed. For example, the first buffer layer 121 may include at least one hole 21, e.g., a plurality of holes 21, exposing the silicon substrate 110.

Figure 2:
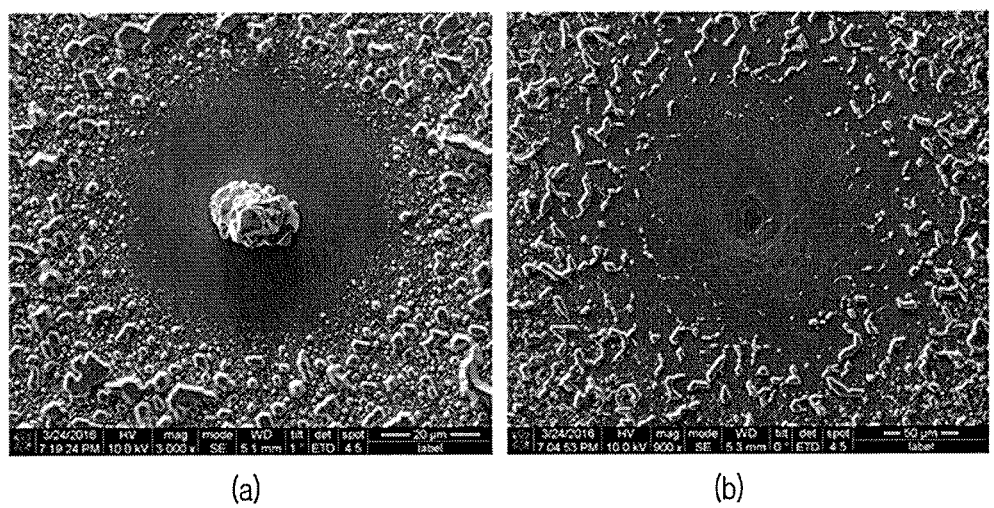
FIG. 2 illustrates an image of a first buffer layer with holes according to the exemplary embodiment.

FIG. 2 illustrates an image when the silicon substrate is not covered by foreign particles in an actual depositing process. Part (a) of FIG. 2 illustrates an image in which holes where the buffer layer is not formed are formed around or at the particles in the process of depositing the buffer layer by positioning the particles. Part (b) of FIG. 2 illustrates an image in which the silicon substrate is exposed by the holes of the buffer layer after the particles are removed.

In the region where the silicon substrate 110 is not covered by the first buffer layer 121 and remains exposed, in a subsequent process of depositing the GaN layer 140, the silicon and the Ga source could meet and thus a melt back phenomenon could occur. The melt back could occur where the silicon and the GaN directly contact each other when the GaN is grown on the silicon substrate 110 to cause breakage and the like in the formed GaN layer 140.

The buffer layer and the like may be formed therebetween (e.g., between the silicon substrate 110 and the GaN layer) to help prevent the silicon substrate 110 and the GaN layer 140 from directly contacting each other. Even when the buffer layer is formed, a region where the buffer layer is not formed or is incompletely formed (e.g., due to the presence of the foreign particles 11 in the deposition chamber 1000 as described above) may be generated. Thus, the melt back phenomenon may not be completely prevented.

In an implementation, after the first buffer layer 121 is formed, the particles 11 may be removed by physically cleaning the first buffer layer 121, and a second buffer layer 122 may be formed on the first buffer layer 121 to help prevent the melt back phenomenon from occurring.

For example, referring to part (c) of FIG. 1, the first buffer layer 121 may be physically cleaned. For example, the physical cleaning may be performed in the cleaning apparatus 2000 outside the deposition chamber 1000. For example, forming the first buffer layer 121 may be performed in the deposition chamber 1000, and the physical cleaning may be performed by a separate process in the cleaning apparatus 2000 after the silicon substrate 110 with the first buffer layer 121 is taken out of the deposition chamber 1000.

The physical cleaning may include, e.g., nano spray or ultrasonic wave cleaning. The nano spray is a method of spraying water onto the substrate using a nano spray apparatus to clean the substrate. The ultrasonic wave cleaning is a method of cleaning the substrate by applying high-frequency vibration energy to a liquid as a technique of using a cavitation effect and a particle acceleration effect of ultrasound for cleaning. As such, the cleaning of the first buffer layer 121 according to the exemplary embodiment may be physically performed by using water and may not include a separate chemical cleaning process. For example, the particles on the first buffer layer 121 may be inorganic particles, e.g., Ga particles, rather than organic particles. Inorganic particles may not be removed well by a chemical cleaning of simply using a cleaning solution or the like, and may need to be physically cleaned by using physical pressure or energy to be removed.

Next, referring to part (d) of FIG. 1, the second buffer layer 122 may be formed on the first buffer layer 121. The second buffer layer 122 may include, e.g., AlN, TaN, TiN, HfN, or HfTi. The second buffer layer 122 may be formed by an HVPE method or an MOCVD method. The description of the deposition process of the second buffer layer 122 may be the same as the description for the deposition process of the first buffer layer 121. A repeated detailed description for the same process may be omitted.

In an implementation, the first buffer layer 121 and the second buffer layer 122 may be made of the same material or different materials. In an implementation, both the first buffer layer 121 and the second buffer layer 122 may include, e.g., AlN.

The second buffer layer 122 may be formed on the first buffer layer 121, and the holes 21 of the first buffer layer 121 may be filled by the second buffer layer 122. In the process of forming the second buffer layer 122, the foreign particles 11 may be positioned on the first buffer layer 121, and the second buffer layer 122 may not be formed on the surface of the first buffer layer 121 (e.g., where the contaminant or particles 11 end up), and the at least one hole 21 may be formed. For example, like the process of forming the first buffer layer 121, the inorganic particles such as gallium particles in the deposition chamber may end up in or on the first buffer layer 121 to hinder the growth of the second buffer layer 122. For example, the second buffer layer 122 may include the at least one hole 21, e.g., a plurality of holes 21.

The holes of the first buffer layer 121 and the second buffer layer 122 may not overlap with each other, e.g., may be offset or may not be aligned with each other. The first buffer layer 121 may be positioned below the second buffer layer 122 (e.g., such that the first buffer layer 121 is between the second buffer layer 122 and the silicon substrate 110), and the hole 21 in the second buffer layer 122 may not expose the silicon substrate 110.

Next, referring to parte (e) of FIG. 1, the second buffer layer 122 may be physically cleaned. For example, the physical cleaning may be performed in the cleaning apparatus 2000 outside the deposition chamber 1000. The physical cleaning may include nano spray or ultrasonic wave cleaning. The physical cleaning of the second buffer layer 122 may be the same as the description for the physical cleaning for the first buffer layer 121 described above. A repeated detailed description for the same process may be omitted.

In an implementation, the physical cleaning of the second buffer layer 122 may be omitted. For example, the first buffer layer 121 may be positioned below the second buffer layer 122, and even if the particles on the second buffer layer 122 are not removed, a problem may not occur in a subsequent process. In an implementation, for simplifying the process, the physical cleaning of the second buffer layer 122 may be omitted.

In an implementation, the buffer layer may include the first buffer layer 121 and the second buffer layer 122. In an implementation, the buffer layer may include three or more buffer layers. For example, an $n^{th}$ buffer layer (in which n is an integer of 3 to 10) may be formed on the second buffer layer 122 and the forming process is the same as those described in the forming of the first buffer layer 121 and the second buffer layer 122 above. For example, a total of 3 to 10 buffer layers may be formed on the silicon substrate 110 (prior to forming the GaN layer 140).

Next, referring to part (f) of FIG. 1, an intermediate layer 130 may be formed on the second buffer layer 122. The intermediate layer 130 may help alleviate a lattice defect between the second buffer layer 122 and the GaN layer 140 to be deposited thereafter. The intermediate layer 130 may help control a crystal defect of the GaN layer 140 formed on the top thereafter to help improve quality of the GaN layer 140.

In an implementation, the intermediate layer 130 may include, e.g., AlGaN or GaN. For example, when the intermediate layer 130 includes GaN, at a temperature of 1,000° C. to 1,2000° C. and under a hydrogen atmosphere, the intermediate layer 130 may be formed by flowing trimethyl gallium (TMGa) and $NH_3$ on the surface of the second buffer layer 122. For example, when the intermediate layer 130 includes AlGaN, at a temperature of 1,000° C. to 1,200° C. and under a hydrogen atmosphere, the intermediate layer 130 may be formed by flowing TMAl, TMGa and $NH_3$ on the surface of the second buffer layer 122.

In an implementation, forming the intermediate layer 130 may be omitted. In an implementation, in order to simplify the process, a process of forming the GaN layer 140 immediately or directly on the second buffer layer 122 (e.g., without forming the intermediate layer 130) is also possible.

Referring to part (g) of FIG. 1, the GaN layer 140 may be formed on the intermediate layer 130. When the process of forming the intermediate layer 130 is omitted, the GaN layer 140 may be formed directly on the second buffer layer 121. The forming of the GaN layer 140 may be performed in the deposition chamber 1000.

The GaN layer 140 may be formed by flowing TMGa and $NH_3$ onto the upper surface of the intermediate layer 130, e.g., at a temperature of 950° C. to 1,200° C. and under a hydrogen atmosphere. In an implementation, the GaN layer 140 may be deposited by a hybrid vapor phase epitaxy (HVPE) method. The growth rate of GaN in the case of using the HVPE method may be larger than that in the MOCVD method, and a thick GaN layer 140 may be grown with a large area. For example, in an HVPE reactor, HCl and Ga metal may react with each other to form GaCl and then GaCl may react with $NH_3$ to grow the GaN layer 140 on the second buffer layer 121.

In an implementation, the GaN layer 140 may be deposited with or to a thickness of, e.g., 10 nm to 10 cm. In an implementation, the GaN layer 140 may be deposited with or to a thickness of, e.g., 1 cm to 5 cm.

In the previous step, through the physical cleaning process of the first buffer layer 121 and the process of forming the second buffer layer 122 on the first buffer layer 121, the GaN layer 140 deposited in the present step may not contact the silicon substrate 110. Accordingly, the melt back phenomenon that could otherwise occur due to contact between the silicon substrate 110 and the GaN layer 140 may be advantageously prevented.

Next, referring to part (h) of FIG. 1, a gallium nitride substrate 200 made of only the GaN layer 140 may be formed by removing remaining structures except for the GaN layer 140. For example, the silicon substrate 110, the first buffer layer 121, the second buffer layer 122 and the intermediate layer 130 may be removed from the GaN layer by a chemical reaction using gas such as HCl or $Cl_2$. In this case, a temperature at which the silicon substrate 110 and the like are removed may be 500° C. to 1,200° C. In an implementation, the silicon substrate 110, the first buffer layer 121, the second buffer layer 122 and the intermediate layer 130 may be removed by wet etching or dry etching.

As described above, the manufacturing method of the gallium nitride substrate according to the exemplary embodiment may help prevent the melt back phenomenon from occurring by physically cleaning the first buffer layer 121 and forming the second buffer layer on the first buffer layer. For example, the first buffer layer 121 with the plurality of holes 21 may be formed by removing the foreign particles 11 by physical cleaning, and the holes of the first buffer layer 121 may be filled by the second buffer layer 122 by forming the second buffer layer 122 on the first buffer layer 121, thereby preventing the silicon substrate 110 from contacting the GaN layer 140 (e.g., as the GaN layer 140 is being formed) and preventing the melt back phenomenon.

Figure 3:
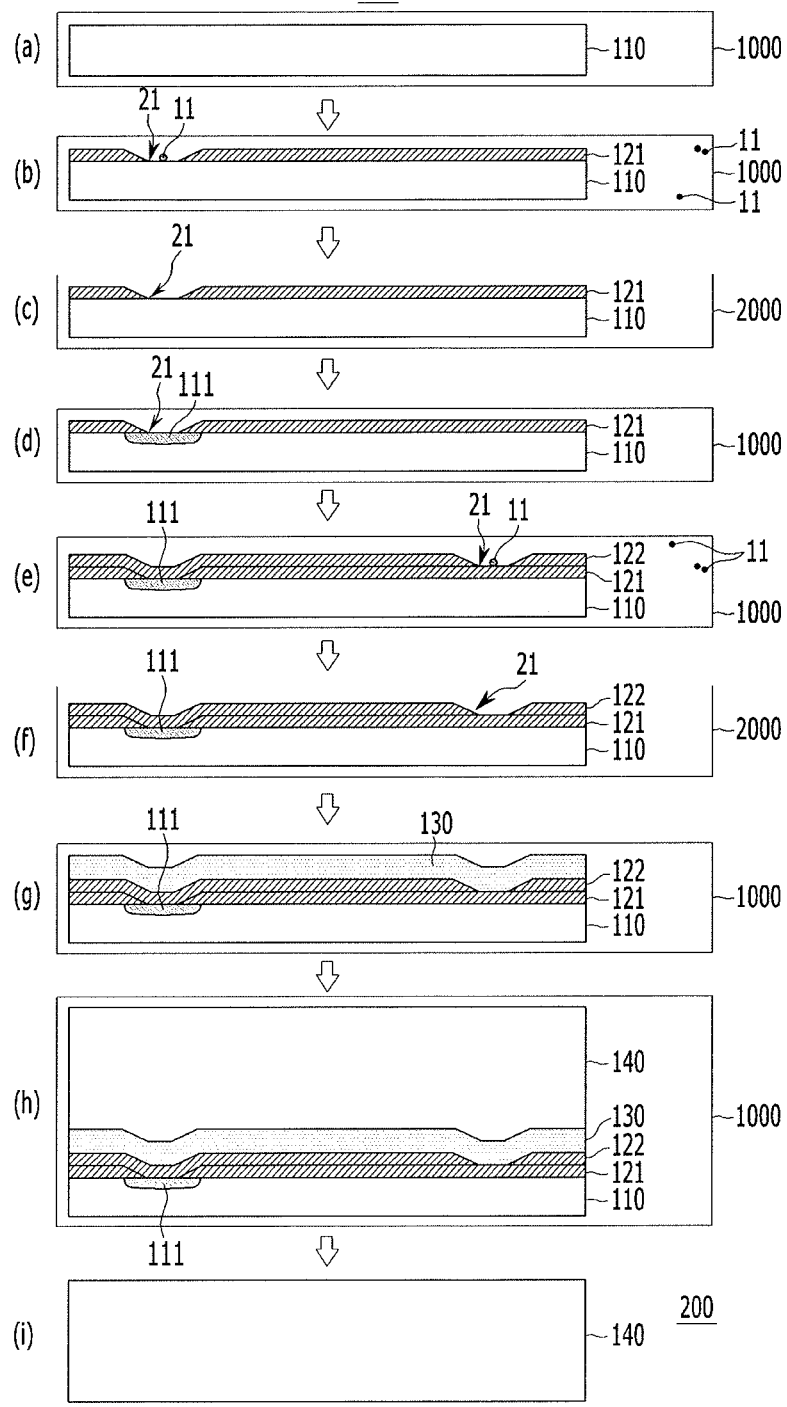
FIG. 3 illustrates a cross-sectional view of stages in a manufacturing process of a gallium nitride substrate according to another exemplary embodiment.

A manufacturing process of a gallium nitride substrate according to another exemplary embodiment will be described. FIG. 3 illustrates stages in a manufacturing process of a gallium nitride substrate according to another exemplary embodiment.

Referring to part (a) of FIG. 3, a silicon substrate 110 may be prepared. The substrate 110 may be a silicon substrate having a surface orientation of {111}.

Next, referring to part (b) of FIG. 3, a first buffer layer 121 may be formed on the silicon substrate 110. The first buffer layer 121 may include, e.g., AlN, TaN, TiN, HfN, or HfTi. In an implementation, the first buffer layer 121 may be formed with a view toward preventing Ga atoms from contacting the silicon substrate 110, and may not include Ga. The first buffer layer 121 may have a thickness of, e.g., 5 nm to 10 μm. In an implementation, the first buffer layer 121 may have a thickness of, e.g., 500 nm to 1.5 μm. At least one hole 21 may be formed in the first buffer layer 121 due to the presence of a particle 11.

Next, referring to part (d) of FIG. 3, the first buffer layer 121 may be physically cleaned to remove foreign particles 11. In this case, the physical cleaning may be performed in the cleaning apparatus 2000 outside the deposition chamber 1000. The physical cleaning may include nano spray or ultrasonic wave cleaning. In the step, the first buffer layer 121 may include at least one hole 21 exposing the silicon substrate 110.

The process corresponding to parts (a) to (c) of FIG. 3 of the exemplary embodiment is the same as the description of the process for parts (a) to (c) of FIG. 1 described above. A repeated detailed description for the same process may be omitted.

Next, referring to part (d) of FIG. 3, a silicon nitride region 111 may be formed on or at the surface of the silicon substrate 110, which is exposed by the hole 21 in the first buffer layer 121. For example, the silicon nitride region 111 may be formed by flowing $N_2$ and $NH_3$ onto the upper surface of the silicon substrate 110 (e.g., the portion of the silicon substrate 110) exposed by or through the hole 21 in the first buffer layer 121, and reacting silicon (of the silicon substrate 110) with the $N_2$ and $NH_3$. The forming of the silicon nitride region 111 may be performed in the deposition chamber 1000. For example, the deposition chamber 1000 may already include $N_2$ and $NH_3$ sources and the like, and a separate reaction chamber for forming the silicon nitride region 111 may not be required.

In the step, the portion of the silicon substrate 110 covered by the first buffer layer 121 may not react with $NH_3$ and the like, and the portion of the silicon substrate 110 exposed by or through the hole 21 of the first buffer layer 121 may react with $NH_3$. Accordingly, a part of the silicon substrate 110 may be converted to silicon nitride to form the silicon nitride region.

In an implementation, the silicon nitride region 111 may include various silicon nitride materials, e.g., SiN, $Si_2N_3$, and $Si_3N_4$. For example, $SiN_x$ or $Si_xN_y$ (in which x and y are natural numbers of 1 to 4) may be included.

In the case where the silicon nitride region 111 is formed, when forming the GaN layer 140 in a subsequent step, contact between Ga of the GaN layer 140 and Si of the silicon substrate 110 may be avoided to help prevent the melt back from occurring. For example, the silicon nitride region 111 may have an insulating characteristic to separate the silicon substrate 110 and the GaN layer 140 from each other. A thickness of the silicon nitride region 111 may be, e.g., 1 Å to 10 nm.

Next, referring to part (e) of FIG. 3, the second buffer layer 122 may be formed on the first buffer layer 121. The second buffer layer 122 may include, e.g., AlN, TaN, TiN, HfN, or HfTi. In an implementation, the first buffer layer 121 and the second buffer layer 122 may be made of the same material or different materials. In an implementation, both the first buffer layer 121 and the second buffer layer 122 may include AlN. The second buffer layer 122 may be formed on the first buffer layer 121, and the at least one hole 21 in the first buffer layer 121 may be filled by the second buffer layer 122. In the process of forming the second buffer layer 122, the foreign particles 11 may be on the first buffer layer 121, and the second buffer layer 122 may not formed on the surface of the first buffer layer 121 where the particles 11 are found, and at least one hole 21 in the second buffer layer 122 may be formed. In an implementation, the at least one hole 21 in the second buffer layer 122 and the at least one hole 21 in the first buffer layer 121 may not overlap with each other, e.g., may be offset or otherwise vertically misaligned with each other.

Next, referring to part (f) of FIG. 3, the second buffer layer 122 may be physically cleaned. In an implementation, the physical cleaning process of the second buffer layer 122 may be omitted. The forming and physical cleaning processes of the second buffer layer 122 in parts (e) and (f) of FIG. 3 may be the same as described in parts (d) and (e) of FIG. 1 described above. The detailed description for the same process may be omitted.

In an implementation, in the manufacturing method of the gallium nitride substrate according to the exemplary embodiment, the forming of the second buffer layer 122 may be omitted. For example, in the exemplary embodiment of FIG. 1, the second buffer layer 122 may be formed on the first buffer layer 121 including the at least one hole 21, and the second buffer layer 122 may fill the at least one hole 21 in the first buffer layer 121 to prevent the GaN layer 140 and the silicon substrate 110 from contacting each other. In the present embodiment, the silicon nitride region 111 may be formed in the silicon substrate 110 exposed by or through the at least one hole 21 in the first buffer layer 121, and even if the second buffer layer 121 is omitted, the silicon substrate 110 and the GaN layer 140 may not contact each other. In an implementation, the buffer layer may include the first buffer layer 121 alone or both the first buffer layer 121 and the second buffer layer 122. In an implementation, an $n^{th}$ buffer layer (in which n is an integer of 3 to 10) may be formed on the second buffer layer 122, and the forming process may be the same as those described in the forming of the first buffer layer 121 and the second buffer layer 122 above.

Next, referring to part (g) of FIG. 3, an intermediate layer 130 may be formed on the second buffer layer 122. The intermediate layer 130 may help alleviate a lattice defect between the second buffer layer 122 and the GaN layer 140 to be deposited thereafter. The intermediate layer 130 may help control a crystal defect of the GaN layer 140 formed thereon to help improve quality of the GaN layer 140.

The intermediate layer 130 may include, e.g., AlGaN or GaN. In an implementation, the forming of the intermediate layer 130 may be omitted.

Next, referring to part (h) of FIG. 3, the GaN layer 140 may be formed on the intermediate layer 130. When the process of forming the intermediate layer 130 is omitted, the GaN layer 140 may be formed on, e.g., directly on, the second buffer layer 122. In an implementation, when both the process of forming the intermediate layer 130 and the process of forming the second buffer layer 122 are omitted, the GaN layer 140 may be formed on, e.g., directly on, the first buffer layer 121. The GaN layer 140 may be deposited with or to a thickness of 10 nm to 10 cm. In an implementation, the GaN layer 140 may be deposited to a thickness of 1 cm to 5 cm. The GaN layer 140 may be formed by a MOCVD or HVPE method.

Next, referring to part (i) of FIG. 3, a gallium nitride substrate made of only the GaN layer 140 may be formed by removing the remaining structures except for the GaN layer 140, e.g., by isolating the GaN layer 140. The steps of parts (g) to (i) of FIG. 3 are the same as described in the steps of parts (f) to (h) of FIG. 1 above. A repeated detailed description for the same process may be omitted.

As such, in the manufacturing method of the gallium nitride substrate according to the present embodiment, the particles 11 may be removed by physically cleaning the first buffer layer 121, and the silicon nitride region 111 may be formed in the region of the silicon substrate 110 exposed through the at least one 21 of the first buffer layer 121 to prevent the silicon substrate 110 and the GaN layer 140 from contacting each other. Accordingly, the melt back phenomenon may be prevented.

A manufacturing process of a gallium nitride substrate according to yet another exemplary embodiment will be described with reference to FIG. 4.

Figure 4:
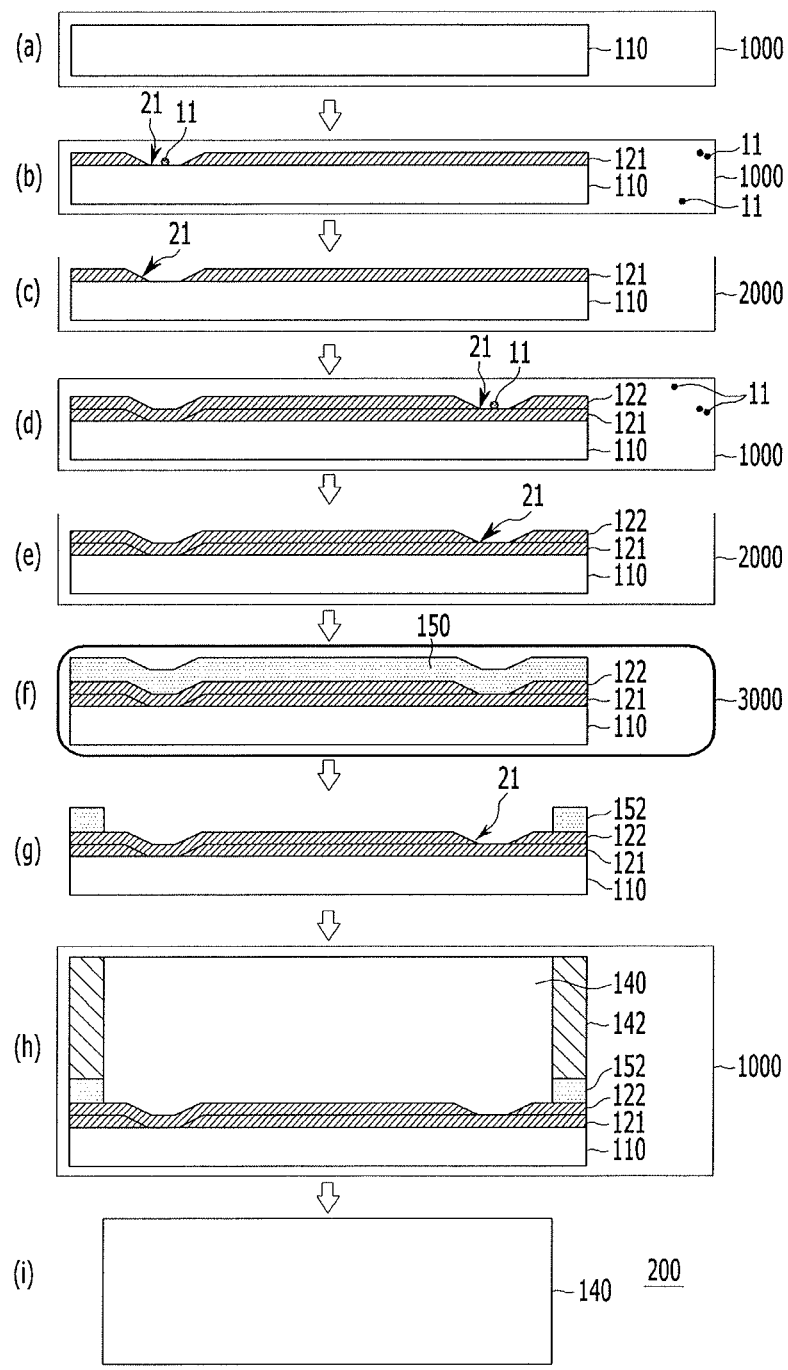
FIG. 4 illustrates a cross-sectional view of stages in a manufacturing process of a gallium nitride substrate according to yet another exemplary embodiment.

FIG. 4 illustrates stages in a manufacturing process of a gallium nitride substrate according to yet another exemplary embodiment. Referring to FIG. 4, the manufacturing process of the gallium nitride substrate according to the exemplary embodiment may be similar to the manufacturing process of the gallium nitride substrate according to the exemplary embodiment of FIG. 1. A repeated detailed description of the same or similar processes may be omitted.

For example, referring to part (a) of FIG. 4, a silicon substrate 110 may be prepared. The substrate 110 may be a silicon substrate having a surface orientation of {111}.

Next, referring to part (b) of FIG. 4, a first buffer layer 121 may be formed on the silicon substrate 110. The first buffer layer 121 may include, e.g., AlN, TaN, TiN, HfN, or HfTi. In an implementation, the first buffer layer 121 may be formed with a view toward preventing Ga atoms from contacting the silicon substrate 110, and may not include Ga. The first buffer layer 121 may have a thickness of 5 nm to 10 μm. In an implementation, the first buffer layer 121 may have a thickness of 500 nm to 1.5 μm. At least one hole 21 may be present in the first buffer layer 121 due to the presence of a contaminant or particle 11 on the silicon substrate 110.

Next, referring to part (c) of FIG. 4, the first buffer layer 121 may be physically cleaned to remove foreign particles 11. For example, the physical cleaning may be performed in the cleaning apparatus 2000 outside the deposition chamber 1000. The physical cleaning may include nano spray or ultrasonic wave cleaning. In the step, the first buffer layer 121 may include at least one, e.g., a plurality of holes 21, exposing portions of the silicon substrate 110.

Next, referring to part (d) of FIG. 4, the second buffer layer 122 may be formed on the first buffer layer 121. The second buffer layer 122 may include, e.g., AlN, TaN, TiN, HfN, or HfTi. In an implementation, the first buffer layer 121 and the second buffer layer 122 may be made of the same material or different materials. In an implementation, both the first buffer layer 121 and the second buffer layer 122 may include aluminum nitride.

The second buffer layer 122 may be formed on the first buffer layer 121, and any holes 21 in the first buffer layer 121 may be filled by the second buffer layer 122. In the process of forming the second buffer layer 122, foreign particles 11 may be present on the first buffer layer 121, the second buffer layer 122 may not be formed on the surface of the first buffer layer 121 where the contaminants or particles 11 are present, and at least one hole 21 may be formed or may be present in the second buffer layer 122. In an implementation, the hole(s) 21 in the second buffer layer 122 and the hole(s) 21 in the first buffer layer 121 may not overlap with each other.

Next, referring to part (e) of FIG. 4, the second buffer layer 122 may be physically cleaned in the cleaning apparatus 2000. In an implementation, the physical cleaning process of the second buffer layer 122 may be omitted. The steps of parts (a) to (e) of FIG. 4 may be similar to the steps of parts (a) to (e) of FIG. 1 above. A repeated detailed description for the same or similar constituent elements may be omitted.

In an implementation, the buffer layer may include both the first buffer layer 121 and the second buffer layer 122 or may include three layers or more. For example, an $n^{th}$ buffer layer (in which n is an integer of 3 to 10) may be formed on the second buffer layer 122 and the forming process may be the same as those described in the forming of the first buffer layer 121 and the second buffer layer 122 above.

Referring to part (f) of FIG. 4, an insulating layer 150 may be formed on the second buffer layer 122. The forming of the insulating layer 150 may be performed in a reactor 3000. The insulating layer 150 may be formed by a CVD, sputtering, or evaporation method. A thickness of the insulating layer 150 may be 1 nm to 100 μm. The insulating layer 150 may include, e.g., silicon oxide, silicon nitride, alumina, or hafnium oxide.

Next, referring to part (g) of FIG. 4, an insulating layer pattern 152 may be formed at an edge of the upper surface of the second buffer layer 122 (e.g., a surface of the second buffer layer 122 that faces away from the silicon substrate 110) by patterning the insulating layer 150. In the case where the silicon substrate 110 has a circular shape, the insulating layer pattern 152 may have a circular band or ring shape positioned along a circumference of the circle. The patterning of the insulating layer 150 may be performed by wet etching or dry etching. A width of the insulating layer pattern 152 may be approximately 0.5 mm to 5 mm.

Next, referring to part (h) of FIG. 4, a structure may be put in the deposition chamber 1000 again and the GaN layer 140 may be formed on the second buffer layer 122. The GaN layer 140 may be formed by an HVPE method or an MOCVD method. In this case, a monocrystal GaN layer 140 may be grown on the second buffer layer 122, and a polycrystalline GaN layer 142 may be formed on the insulating layer pattern 152. For example, the insulating layer pattern 152 may include silicon oxide, silicon nitride, alumina, or hafnium oxide, which may not be suitable for growing GaN to a monocrystal.

Next, referring to part (i) of FIG. 4, a gallium nitride substrate 200 made of only the GaN layer 140 may be formed by removing the remaining structures except for the GaN layer 140 (e.g., by isolating the GaN layer 140). This step may be the same as described with respect to part (h) of FIG. 1, above. The detailed description for the same process may be omitted.

In the removing step, the polycrystalline GaN layer 142 on the insulating layer pattern 152 may be removed together. The monocrystal GaN layer 140 and the polycrystalline GaN layer 142 may be easily released due to a difference in crystal structure. Accordingly, the polycrystalline GaN layer 142 may be easily detached from the monocrystal GaN layer 140.

In the case where the insulating layer pattern 152 is formed and the polycrystalline GaN layer 142 is formed thereon and removed, the melt back may be prevented from occurring as compared with the case where the processes are not included. For example, in the manufacturing process of the gallium nitride substrate, cracks on the buffer layer could mainly be generated in an edge region, and in the manufacturing method according to the exemplary embodiment, the insulating layer pattern may be formed on the edge region and the melt back may be prevented from occurring through the cracks. Accordingly, a large-area GaN substrate having good quality may be manufactured on the silicon substrate.

Figure 5:
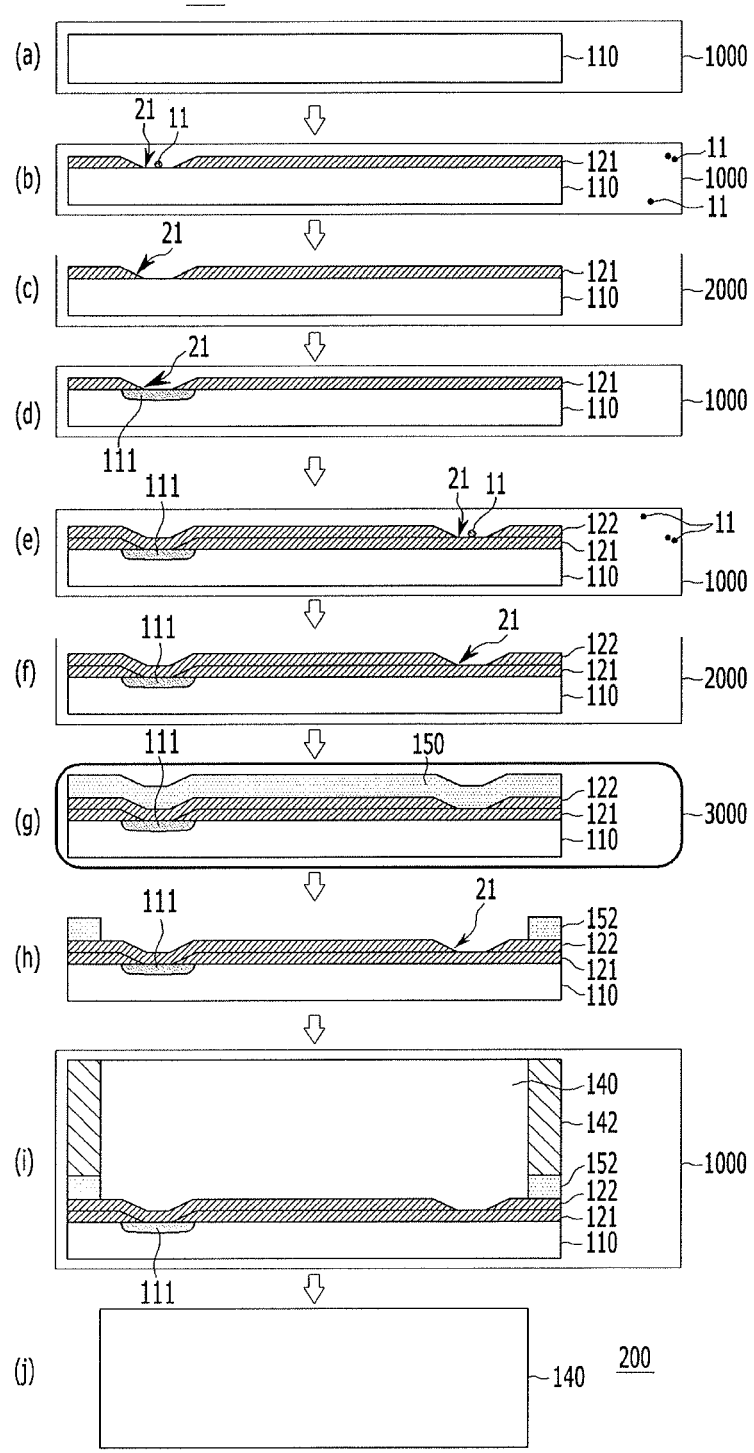
FIG. 5 illustrates a cross-sectional view of stages in a manufacturing process of a gallium nitride substrate according to still another exemplary embodiment.

A manufacturing process of a gallium nitride substrate according to still another exemplary embodiment will be described with reference to FIG. 5. FIG. 5 illustrates stages in a manufacturing process of a gallium nitride substrate according to still another exemplary embodiment. Referring to FIG. 5, the manufacturing process of the gallium nitride substrate according to the exemplary embodiment may include forming a first buffer layer 121 including at lest one hole and a second buffer layer 122 including at least one, forming a silicon nitride region 111 on a silicon substrate 110 exposed through the at least one hole 21 in the first buffer layer 121, and forming an insulating layer pattern 152 on the second buffer layer 122.

Referring to part (a) of FIG. 5, a silicon substrate 110 may be prepared. The substrate 110 may be a silicon substrate having a surface orientation of {111}.

Next, referring to part (b) of FIG. 5, a first buffer layer 121 may be formed on the silicon substrate 110. The first buffer layer 121 may include, e.g., AlN, TaN, TiN, HfN, or HfTi. In an implementation, the first buffer layer 121 may be formed with a view toward preventing Ga atoms from contacting the silicon substrate 110 and thus may not include Ga.

Next, referring to part (c) of FIG. 5, the first buffer layer 121 may be physically cleaned in a cleaning apparatus 2000 to remove foreign particles 11. In the step, the first buffer layer 121 may include at least one hole 21 exposing the silicon substrate 110. The processes of parts (a) to (c) of FIG. 5 may be the same as the processes of parts (a) to (c) of FIG. 1, above. A repeated detailed description for the same constituent elements may be omitted.

Next, referring to part (d) of FIG. 5, a silicon nitride region 111 may be formed on a region of the silicon substrate 110 that is exposed by the at least one hole 21 in the first buffer layer 121. The silicon nitride region 111 may be formed in the deposition chamber 1000 and may be formed by flowing $N_2$ and $NH_3$ onto the surface of the silicon substrate 110 exposed through the at least one hole 21 in the first buffer layer 121 to thus react silicon and $N_2$ and $NH_3$. The silicon nitride region 111 may include various silicon nitride materials, e.g., SiN, $Si_2N_3$, and $Si_3N_4$. For example, SiNx or SixNy (x and y are natural numbers of 1 to 4) may be included. A thickness of the silicon nitride region 111 may be 1 Å to 10 nm.

Next, referring to part (e) of FIG. 5, the second buffer layer 122 may be formed on the first buffer layer 121. The second buffer layer 122 may include, e.g., AlN, TaN, TiN, HfN, or HfTi. In an implementation, the first buffer layer 121 and the second buffer layer 122 may be made of the same material or different materials. In an implementation, both the first buffer layer 121 and the second buffer layer 122 may include aluminum nitride. The second buffer layer 122 may be formed on the first buffer layer 121, and the at least one hole 21 in the first buffer layer 121 may be filled by the second buffer layer 122. In the process of forming the second buffer layer 122, the foreign particles 11 may be on the first buffer layer 121, and the second buffer layer 122 may not be formed on the front surface of the first buffer layer 121 (where the foreign particles 11 have come to rest), and the at least one hole 21 may be formed. In an implementation, the at least one hole 21 in the second buffer layer 122 and the at least one hole 21 in the first buffer layer 121 may not overlap with each other.

Next, referring to part (f) of FIG. 5, the second buffer layer 122 may be physically cleaned. In an implementation, the physical cleaning process of the second buffer layer 122 may be omitted.

The processes of parts (d) to (f) of FIG. 5 may be the same as those described in parts (d) to (f) of FIG. 3, above. A repeated detailed description for the same or similar constituent elements may be omitted.

Next, referring to part (g) of FIG. 5, an insulating layer 150 may be formed on the second buffer layer 122. The insulating layer 150 may be formed in a reactor 3000 and the insulating layer 150 may include, e.g., silicon oxide, silicon nitride, alumina, or hafnium oxide.

Next, referring to part (h) of FIG. 5, an insulating layer pattern 152 may be formed at an edge area of the upper surface of the second buffer layer 122 by patterning the insulating layer 150. In the case where the silicon substrate 110 has a circular shape, the insulating layer pattern 152 may have a circular stripe or ring shape positioned along a circumference of the circle.

Next, referring to part (i) of FIG. 5, a structure may be put in the deposition chamber 1000 again and the GaN layer 140 may be formed on the second buffer layer 122. The GaN layer 140 may be formed by an HVPE method or an MOCVD method. In this case, a monocrystal GaN layer 140 may be grown on the second buffer layer 122, and a polycrystalline GaN layer 142 may be formed on the insulating layer pattern 152.

Next, referring to part (j) of FIG. 5, a gallium nitride substrate 200 made of only the GaN layer 140 may be formed by removing the remaining structures except for the GaN layer 140.

The processes of parts (g) to (j) of FIG. 5 may be the same as those described in parts (f) to (i) of FIG. 4, above. A repeated detailed description for the same or similar constituent elements may be omitted.

For example, in the manufacturing method of the gallium nitride substrate according to the exemplary embodiment, it is possible to help prevent a melt back phenomenon by physically cleaning the first buffer layer 121 and forming the second buffer layer 122 on the first buffer layer 121, to help prevent a melt back phenomenon from occurring through cracks in the edge region by forming the insulating layer pattern 152 on the second buffer layer 122 and growing GaN thereon, and to help prevent the melt back by forming the silicon nitride region 111 on the silicon substrate 110 exposed by the holes 21 of the first buffer layer 121.

By way of summation and review, GaN monocrystal may require a high temperature (of approximately 1,500° C.) and a nitrogen atmosphere (of approximately 20,000 atms) for a liquid crystal growth due to high nitrogen vapor pressure at a melting point, and it may be difficult to mass-produce the GaN monocrystal. The GaN monocrystal may be a thin film type having a currently usable crystal size of about 100 mm² and thus it may be difficult to use the GaN monocrystal for fabricating an element.

A GaN thin film may be grown on heterogeneous substrates by using methods such as metal organic chemical vapor deposition (MOCVD) and hydride vapor phase epitaxy (HVPE).

A GaN layer may be grown on a sapphire substrate and then a GaN substrate may be manufactured by removing the sapphire substrate. In the sapphire substrate, it may be difficult to prepare a substrate having a size of approximately 6 inches or more and the price may be expensive. Thus, it may be difficult to use the sapphire substrate for manufacturing a large-area GaN substrate.

A method of growing the GaN layer by using a large-area silicon substrate has been considered. When GaN is grown on the silicon substrate, in the case of directly contacting silicon and GaN, silicon may be diffused into GaN and the silicon substrate surface could be etched. As a result, melt back may occur, and tensile stress may occur on the silicon substrate during GaN growth due to differences in thermal expansion coefficient and lattice constant between the silicon and the GaN and thus cracks could be generated.

The embodiments may provide a method of manufacturing a gallium nitride substrate having advantages of preventing melt back of a silicon substrate and GaN.

<Description of symbols>

| | |
|---|---|
| 11: Particle | 110: Substrate |
| 111: Silicon nitride region | 121: First buffer layer |
| 122: Second buffer layer | 130: Intermediate layer |
| 140: GaN layer | 150: Insulating layer |
| 152: Insulating layer pattern | 200: Gallium nitride substrate |
| 1000: Deposition chamber | 2000: Cleaning apparatus |
| 3000: Reactor | |

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a gallium nitride substrate, the method comprising:
   forming a first buffer layer on a silicon substrate such that the first buffer layer has one or more holes therein due to the presence of one or more impurity particles and the silicon substrate is exposed through the one or more holes in the first buffer layer;
   forming a silicon nitride region in the silicon substrate at the exposed portion of the silicon substrate;
   forming a second buffer layer on the first buffer layer such that the second buffer layer has one or more holes therein; and
   forming a GaN layer on the second buffer layer,
   wherein the one or more holes of the first buffer layer are filled by the second buffer layer.

2. The method as claimed in claim 1, wherein the one or more holes in the first buffer layer and the one or more holes in the second buffer layer are not vertically overlapped with each other.

3. The method as claimed in claim 1, wherein forming the first buffer layer having the one or more holes therein includes:
   depositing the first buffer layer; and
   removing the one or more impurity particles from the first buffer layer by physically cleaning the first buffer layer.

4. The method as claimed in claim 3, wherein:
   forming the first buffer layer is performed in a deposition chamber,
   the physical cleaning is performed outside the deposition chamber, and
   the physical cleaning includes nano spray or ultrasonic wave cleaning.

5. The method as claimed in claim 1, wherein forming the second buffer layer having one or more holes therein includes:
   depositing the second buffer layer; and
   removing impurity particles from the second buffer layer by physically cleaning the second buffer layer.

6. The method as claimed in claim 1, wherein a thickness of the GaN layer is 10 nm to 10 cm.

7. The method as claimed in claim 1, further comprising:
   forming an insulating layer pattern at an edge of an upper surface of the second buffer layer after forming the second buffer layer and prior to forming the GaN layer on the second buffer layer, and
   removing the insulating layer pattern after forming the GaN layer on the second buffer layer.

8. The method as claimed in claim 1, further comprising forming an $n^{th}$ buffer layer on the second buffer layer, wherein:
   n is an integer of 3 to 10, and
   the GaN layer is formed on the $n^{th}$ buffer layer such that the $n^{th}$ buffer layer is between the GaN layer and the second buffer layer.

9. The method as claimed in claim 1, further comprising forming an intermediate layer on the second buffer layer, wherein:
   the GaN layer is formed on the intermediate layer such that the intermediate layer is between the GaN layer and the second buffer layer, and
   the intermediate layer includes GaN or AlGaN.

10. A method of manufacturing a gallium nitride substrate, the method comprising:
    forming a first buffer layer on a silicon substrate such that the first buffer layer has one or more holes therein;
    forming a silicon nitride region in the silicon substrate exposed by the one or more holes; and
    forming a GaN layer on the first buffer layer.

11. The method as claimed in claim 10, wherein forming the first buffer layer and forming the silicon nitride region are performed in a same chamber.

12. The method as claimed in claim 10, wherein forming the first buffer layer having one or more holes therein includes:
    depositing the first buffer layer; and
    removing impurity particles on the first buffer layer by physically cleaning the first buffer layer.

13. The method as claimed in claim 10, wherein the silicon substrate and the GaN layer do not contact each other.

14. The method as claimed in claim 10, further comprising:
    forming an insulating layer pattern at an edge of an upper surface of the first buffer layer after forming the first buffer layer and prior to forming the GaN layer on the first buffer layer, and
    removing the insulating layer pattern after forming the GaN layer on the first buffer layer.

15. The method as claimed in claim 10, further comprising forming an $n^{th}$ buffer layer on the first buffer layer, wherein:
    n is an integer of 2 to 10, and
    the GaN layer is formed on the $n^{th}$ buffer layer such that the $n^{th}$ buffer layer is between the GaN layer and the first buffer layer.

16. A method of manufacturing a gallium nitride substrate, the method comprising:
    providing a silicon substrate;
    forming a first buffer layer on the silicon substrate such that the first buffer layer includes at least one hole therethrough exposing a portion of the silicon substrate;
    forming a barrier at the at least one hole in the first buffer layer;

forming a GaN layer on the first buffer layer such that the GaN layer is physically separated from the silicon of the silicon substrate; and separating the GaN layer, wherein forming the barrier includes forming a silicon nitride region in the portion of the silicon substrate exposed by the at least one hole in the first buffer layer such that the silicon nitride region physically separates the GaN layer and the silicon of the silicon substrate.

17. The method as claimed in claim 16, wherein forming the barrier includes forming at least one additional buffer layer on the first buffer layer such that the at least one additional buffer layer fills the at least one hole in the first buffer layer and physically separates the GaN layer and the silicon of the silicon substrate.

18. The method as claimed in claim 16, further comprising forming an insulating layer pattern at an outer edge of a surface of the first buffer layer that faces away from the silicon substrate prior to forming the GaN layer on the first buffer layer, wherein forming the GaN layer on the first buffer layer includes forming a monocrystalline GaN layer on the first buffer layer and forming a polycrystalline GaN layer on the insulating layer.

* * * * *